United States Patent [19]

Kato et al.

[11] Patent Number: 5,726,757
[45] Date of Patent: Mar. 10, 1998

[54] ALIGNMENT METHOD

[75] Inventors: Masaki Kato; Kinya Kato; Kei Nara, all of Yokohama, Japan

[73] Assignee: Nikon Corporation, Japan

[21] Appl. No.: 719,315

[22] Filed: Sep. 25, 1996

Related U.S. Application Data

[63] Continuation-in-part of Ser. No. 566,420, Nov. 30, 1995, abandoned.

[30] Foreign Application Priority Data

Dec. 1, 1994 [JP] Japan ................................. 6-323925
Dec. 1, 1994 [JP] Japan ................................. 6-323926

[51] Int. Cl.⁶ ........................................ G01B 11/00
[52] U.S. Cl. .................. 356/399; 356/396; 356/388; 356/401
[58] Field of Search ........................... 356/399, 401, 356/373, 375, 388, 395, 396

[56] References Cited

U.S. PATENT DOCUMENTS

| | | | |
|---|---|---|---|
| 3,813,169 | 5/1974 | Kaestner | 356/399 |
| 4,040,736 | 8/1977 | Johannsmeier | 356/399 |
| 4,506,977 | 3/1985 | Sato et al. | 356/399 |
| 4,615,621 | 10/1986 | Allen et al. | 356/399 |
| 5,483,449 | 1/1996 | Caruso et al. | 356/399 |

FOREIGN PATENT DOCUMENTS

| | | |
|---|---|---|
| 60-130742 | 7/1985 | Japan. |
| 61-128106 | 6/1986 | Japan. |
| 62-256804 | 10/1988 | Japan. |

*Primary Examiner*—Frank G. Font
*Assistant Examiner*—Reginald A. Ratliff
*Attorney, Agent, or Firm*—Pennie & Edmonds LLP

[57] ABSTRACT

In an exposure apparatus, an alignment-detecting light component of a mask and that of a plate are spatially separated from each other, thereby enabling highly accurate alignment with little influence of the light from the plate on detection of the mask position. An alignment optical system comprises a light source means for supplying a luminous flux; a scan beam forming optical system for forming, based on the luminous flux, a scan beam at a visual field area on a first substrate with respect to a predetermined optical system; a scanning means for optically scanning, in a predetermined direction, the scan beam formed on the first substrate; a first detection means for detecting a diffracted and reflected light component from a first mark generated when optically scanned with the scan beam formed on the first substrate; and a second detection means for detecting, by way of the predetermined optical system and through a path different from the path through which the diffracted and reflected light component from the first mark is detected, a diffracted and reflected light component from a second mark generated when optically scanned with the scan beam which is formed on the second substrate by way of the predetermined optical system.

18 Claims, 16 Drawing Sheets

DISTANCE BETWEEN MASK AND IMAGE SURFACE

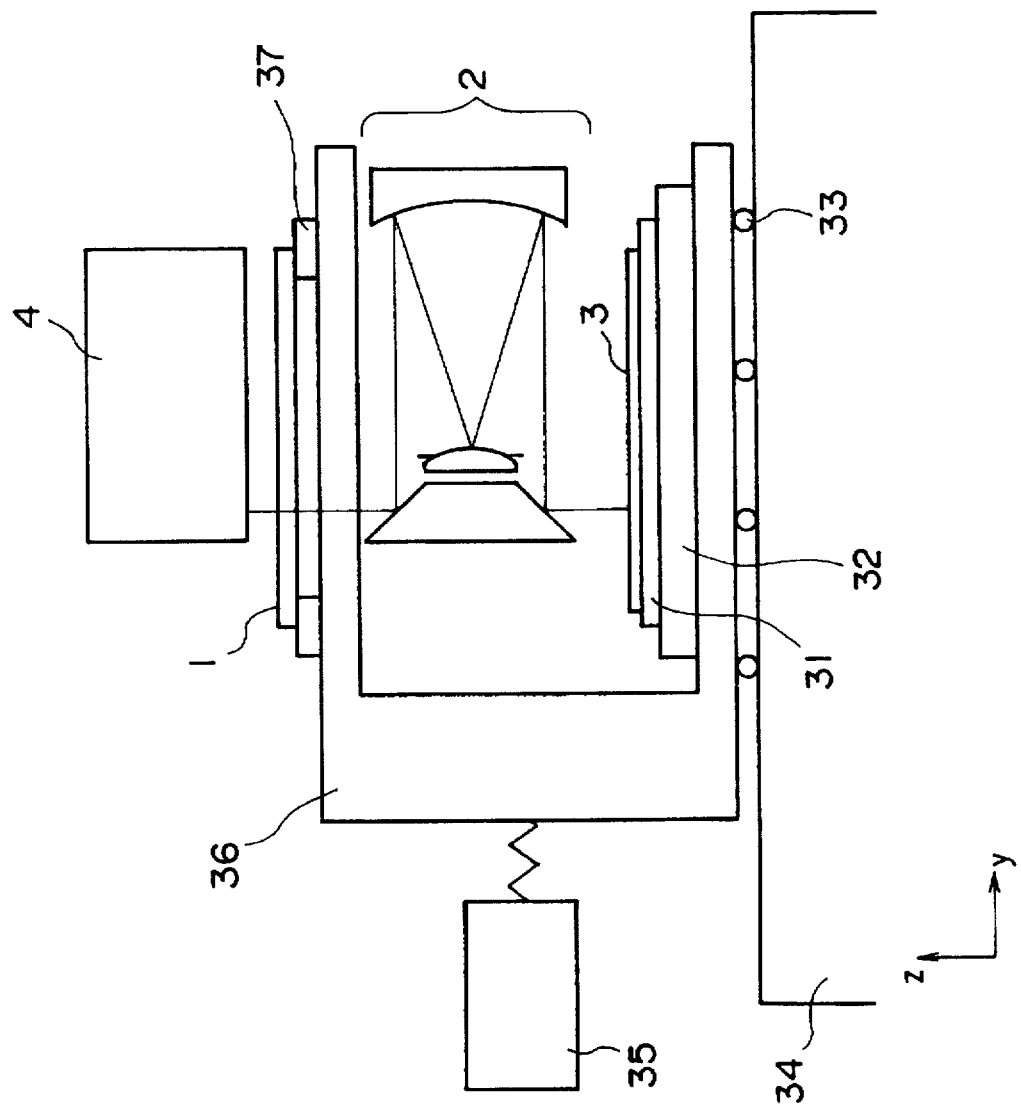

40a          41a 40b          41b 40c          41c

ALIGNMENT METHOD

RELATED APPLICATIONS

This is a countinuation-in-part application of application Ser. No. 08/566,420 filed on Nov. 30, 1995, now abandoned.

BACKGROUND OF THE INVENTION

1. Field of the Invention

The present invention relates to an exposure apparatus and, in particular, to alignment (i.e., relative positioning) of TTR (Through the Reticle) type, TTM (Through the Mask) type, or off-axis type in the exposure apparatus for manufacturing semiconductor elements and liquid crystal display elements.

2. Related Background Art

In the conventional exposure apparatus of such a type, when a reflection type projection optical system (e.g., Offner type optical system or Dyson type optical system) having a low chromatic aberration is used, a mask mark formed in a mask (or reticle) and a plate mark formed in a plate (or wafer) are optically scanned at the same time by way of the projection optical system, the light components (i.e., alignment-detecting light components) from the two marks with respect to the optical scanning are photoelectrically converted, and then their relative positions are read out on the basis of the intensity of thus obtained electric signal so as to effect alignment.

More specifically, in the optical scanning method, the mask and the plate are scanned with a slit-like (linear) scan beam thereon, for example, by action of a polygon mirror or the like. Then, the scattered light components from the mask mark and plate mark with respect to the scan beam are photoelectrically detected. In this manner, based on the intensity signal of the alignment-detecting light obtained by continuous beam scanning, the positions of the mask mark and plate mark are obtained and then the mask and the plate are relatively positioned (i.e., aligned) with each other.

SUMMARY OF THE INVENTION

The present invention relates to an exposure apparatus in which an image of a pattern formed in a first substrate is projected on and transferred to a second substrate by way of a projection optical system. The exposure apparatus comprises an alignment optical system for detecting a first mark formed on the first substrate and a second mark formed on the second substrate by optical scanning so as to measure a positional deviation between the first and second substrates. The alignment optical system comprises a light source means for supplying a luminous flux; a scan beam forming optical system for forming, based on the luminous flux, a scan beam at a visual field area on the first substrate with respect to a predetermined optical system; a scanning means for optically scanning, in a predetermined direction, the scan beam formed on the first substrate; a first detection means for detecting a diffracted and reflected light component from the first mark generated when optically scanned with the scan beam formed on the first substrate; and a second detection means for detecting, by way of the predetermined optical system and through a path different from the path through which the diffracted and reflected light component from the first mark is detected, a diffracted and reflected light component from the second mark generated when optically scanned with the scan beam which is formed on the second substrate by way of the predetermined optical system. In order to prevent a transmitted light component diffracted by the first mark from reaching the second substrate, the predetermined optical system blocks the transmitted light component.

Preferably, the duty ratio of a grating-like mark constituting the first mark is selected such that the intensity of light which passes through the first mark without being diffracted thereby and then reaches the second mark is not higher than a desired value.

In the present invention, a mask mark formed on the first substrate such as a mask and a plate mark formed on the second substrate such as a plate are scanned with a scan beam by way of an optical system, e.g., a projection optical system, in which the mask mark and the plate mark can be simultaneously observed. Then, the alignment-detecting light component from the mask mark is photoelectrically detected by a first detector, whereas the alignment-detecting light component from the plate mark is photoelectrically detected by a second detector by way of, for example, a projection optical system, thereby effecting alignment.

Specifically, the pitch of the grating-like mask mark is appropriately selected such that the sine value of the diffraction angle of the ±1-order diffracted light component from the mask mark is greater than the numerical aperture (NA) of the projection optical system. Accordingly, the ±1-order diffracted and transmitted light component from the mask mark never passes through the projection optical system to reach the plate. As a result, in the alignment light incident on the mask mark, only the zero-order transmitted light component which has passed it through without being diffracted thereby passes through the projection optical system to reach the plate.

On the other hand, the pitch of the grating-like plate mark is appropriately selected such that the sine value of the diffraction angle of the ±1-order diffracted light component from the plate mark is smaller than the numerical aperture of the projection optical system. Accordingly, the ±1-order diffracted and reflected light component from the plate mark can pass through the projection optical system.

Namely, the ±1-order diffracted and reflected light component from the plate mark is guided through a path spatially separated from the path of the ±1-order diffracted and reflected light component from the mask mark, which is the alignment-detecting light component therefrom, and photoelectrically detected by way of the projection optical system.

In this manner, in accordance with the present invention, the alignment-detecting light component from the mask and that from the plate are spatially separated from each other and detected by individual photoelectric detection means without mingling with each other. Namely, the electric gain of the electric signal based on the alignment-detecting light component from the mask and that based on the alignment-detecting light component from the plate can be independently adjusted. Also, since the diffracted and transmitted light component from the mask mark is cut off without reaching the plate, the influence of the light from the plate on the detection of the mask mark can be reduced. Thus, the relative positioning of the mask and the plate with respect to each other can be effected highly accurately in a single optical scanning operation.

Also, in the present invention, it is preferable for the duty ratio of the grating-like mask mark to be appropriately selected such that the zero-order transmitted light component which reaches the plate by way of the projection optical system is reduced to a desired intensity.

In this manner, with respect to the original alignment-detecting light component directly reflected by the mask, the ratio of the light component which passes through the mask mark without being diffracted thereby and then is reflected by the plate so as to return to the mask is reduced to a desired ratio. As a result, even when the diffracted and transmitted light component from the mask mark with respect to the light from the plate mingles with the original alignment-detecting light component, the influence of the light from the plate can be minimized.

Also, the present invention relates to an exposure apparatus in which an image of a pattern formed in a first substrate projectively impinges on a second substrate by way of a projection optical system and which has an alignment optical system relatively movable with respect to the projection optical system. The alignment optical system supplies an alignment light component with respect to a first mark formed at an arbitrary position in the first substrate and a second mark formed at an arbitrary position in the second substrate, then detects, based on light components from the first and second marks, relative positions of the first and second substrates with respect to each other, and further has a focus-matching information detecting means for detecting focusmatching information data of the first and second substrates with respect to the alignment optical system at the positions of the first and second marks, respectively.

Preferably, the focus-matching information detecting means comprises a scan beam forming optical System for forming, based on the alignment light component, a scan beam on the first substrate; a scanning means for optically scanning the scan beam formed on the first substrate; and photoelectric detection means for photoelectrically detecting a light component from the first mark generated when optically scanned with the scan beam formed on the first substrate and a light component from the second mark generated when optically scanned with the scan beam formed on the second substrate by way of the projection optical system, respectively. Based on the electric signals obtained by the photoelectric detection means, the focus-matching information data of the first and second substrates with respect to the alignment optical system are individually detected.

In the present invention, the alignment optical system for detecting the relative positions of the first substrate such as a mask and the second substrate such as a plate with respect to each other, by itself, can determine, as focus-matching information, the best focus positions of the mask and plate at their alignment positions. Accordingly, the best focus positions are determined as the focus-matching information of the mask and plate with respect to the alignment optical system and then relative positioning (i.e., alignment) of the mask and plate with each other is effected at these best focus positions. After the relative positioning of the mask and plate with each other is completed, the mask and the plate can be moved to their best focus positions with respect to the exposure light and then exposed thereto.

Namely, in the present invention, even when the projection optical system generates curvature of field, astigmatism, axial chromatic aberration, and the like due to difference in wavelength between the alignment light and the exposure light, the relative positioning of the mask and the plate with respect to each other can be effected with a high accuracy under a condition where the alignment light is in focus.

Also, even when there is substantially no axial chromatic aberration between the exposure light and the alignment light, as in the case of the projection optical system comprising a Dyson type optical system or an Offner type optical system, there may occur a telecentric collapse due to difference in wavelength. In this case, the positioning error caused by the telecentric collapse can be eliminated when the best focus positions with respect to the alignment light are attained.

Further, in the present invention, since the best focus positions can be determined at alignment positions, the alignment optical system can be relatively moved with respect to the projection optical system so that the mark and the plate are positioned at their best focus positions in arbitrary alignment positions within visual field and exposure areas. In other words, without being restricted to a specific image height of the projection optical system, highly accurate alignment is possible in all the image heights.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIG. 24 shows an another embodiments according to the third embodiments according to the present invention.

DESCRIPTION OF THE PREFERRED EMBODIMENTS

In the alignment optical system of the conventional exposure apparatus such as that mentioned above, it is impossible for the alignment-detecting light component from the mask and that from the plate to be separated from each other. Also, due to difference in reflectivy of the plate, the optical signal from the plate mark may become somewhat larger or quite smaller than that from the mask mark. Accordingly, alignment cannot be effected until after a plurality of optical scanning operations which are performed while sampling each signal.

Also, there are cases where the light component which has passed through the mask mark and then is reflected by the plate to re-enter the mask may act on the mask mark to mingle with the alignment-detecting light component and where the magnitude at which it mingles with the alignment light component may vary during the optical scanning due to unevenness in the resist coated on the plate. As a result, highly accurate alignment cannot be effected.

In order to separate the alignment-detecting light component of the mask from that of the plate, a wavelength plate may be inserted within the projection optical system such that they are separated from each other by polarization. However, the surface irregularity of the wavelength plate may greatly affect the original image-forming property of the projection optical system. Accordingly, the cost of the projection optical system remarkably increases when the original image-forming property of the projection optical system is to be maintained.

In the following, embodiments of the present invention will be explained with reference to attached drawings.

Figure 1:
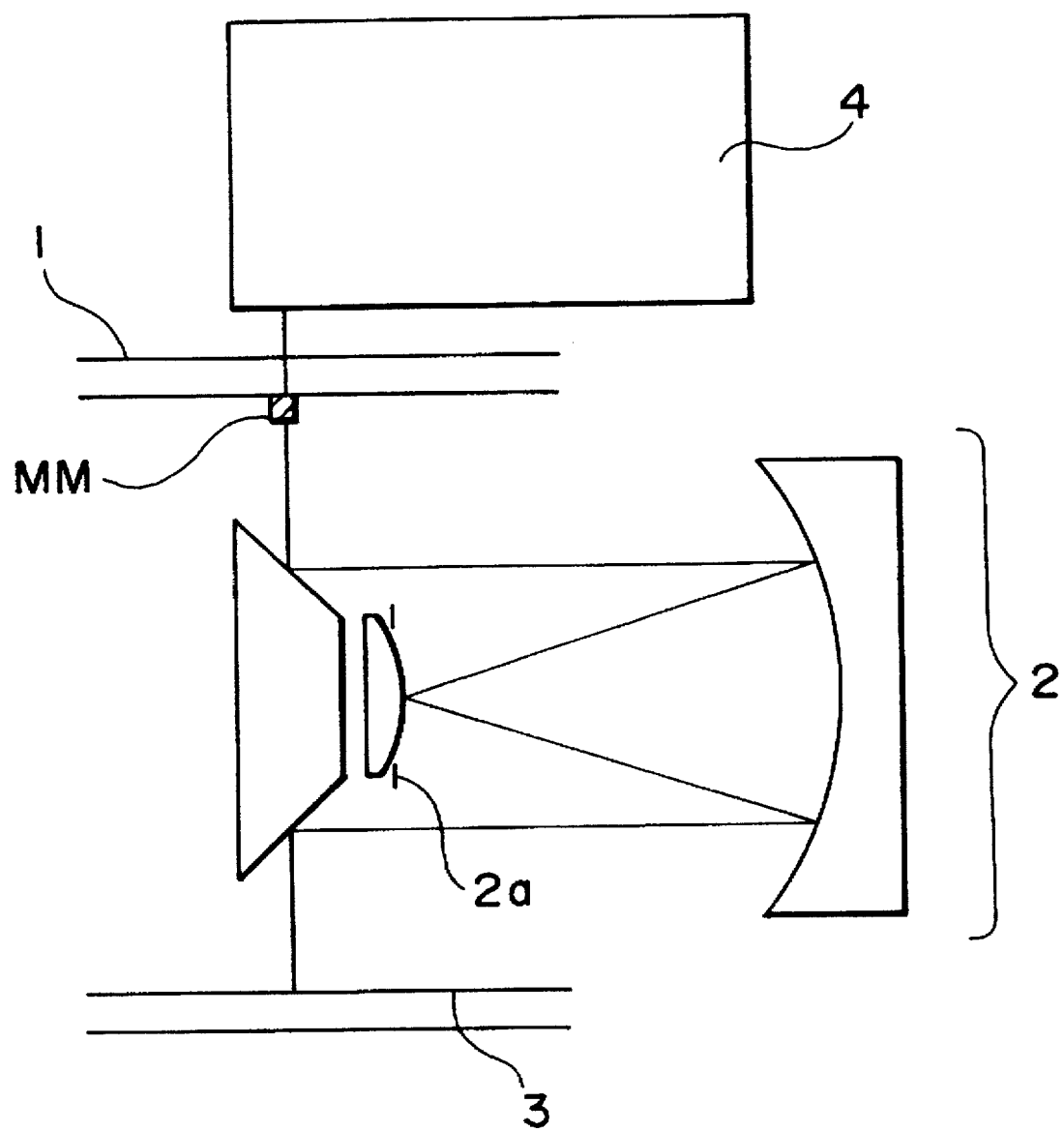
FIG. 1 is a drawing schematically showing the constitution of an exposure apparatus in accordance with the first embodiment of the present invention.
Figure 2:
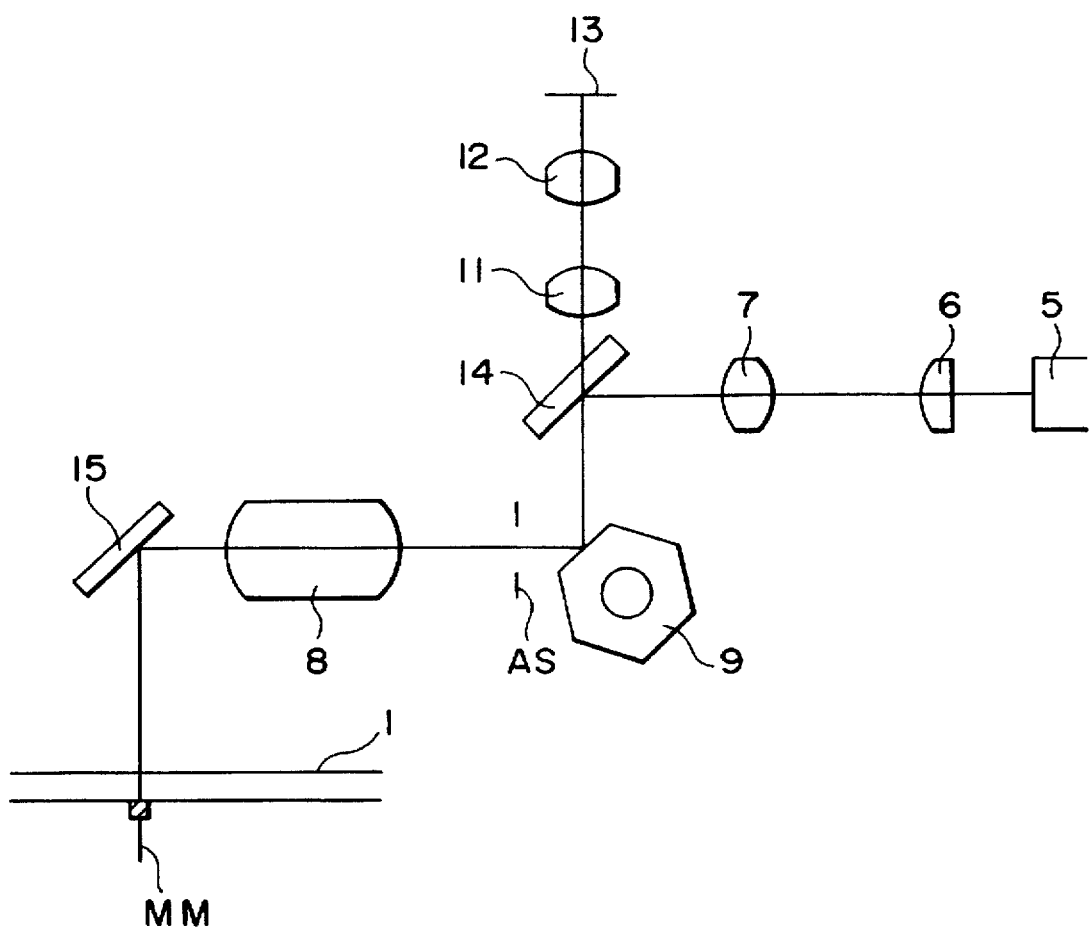
FIG. 2 is a drawing showing the inner constitution of the alignment optical system in FIG. 1.

FIG. 1 is a schematic view showing the constitution of an exposure apparatus in accordance with the first embodiment of the present invention, whereas FIG. 2 is a drawing showing the inner constitution of the alignment optical system in FIG. 1.

The apparatus of FIG. 1 is constructed such that a mask 1 is illuminated by an illumination optical system not depicted and a pattern in the mask 1 is transferred, by way of a projection optical system 2, to a plate 3.

The apparatus of FIG. 1 has an alignment optical system 4 for relatively positioning the mask 1 and the plate 3 with each other. The constitution and principle of the alignment optical system 4 will be explained with reference to FIG. 2.

The alignment optical system 4 has a laser light source 5. The beam emitted from the laser light source 5 is shaped into a linear beam by way of a cylindrical lens 6 and then impinges on a half mirror 14 by way of a second objective lens 7. The beam reflected downward in the drawing by the half mirror 14 is reflected by a polygon mirror 9 and then enters a first objective lens 8 by way of an aperture stop AS.

The light passing through the first objective lens 8 is reflected by a drop mirror 15 and then forms an image as a linear scan beam on the mask 1. As the polygon mirror 9 rotates, the scan beam moves on the mask 1 so that a mask mark MM formed on the mask 1 is optically scanned therewith.

The scattered or diffracted light from the optically-scanned mask mark MM, i.e., alignment-detecting light component, impinges on the half mirror 14 by way of the drop mirror 15, the first objective lens 8, and the polygon mirror 9. The alignment-detecting light component passing through the half mirror 14 is guided, due to the actions of relay lenses 11 and 12, to a detector 13 such as a spatial filter which is positioned optically conjugate with the pupil of the first objective lens 8.

Figure 3:
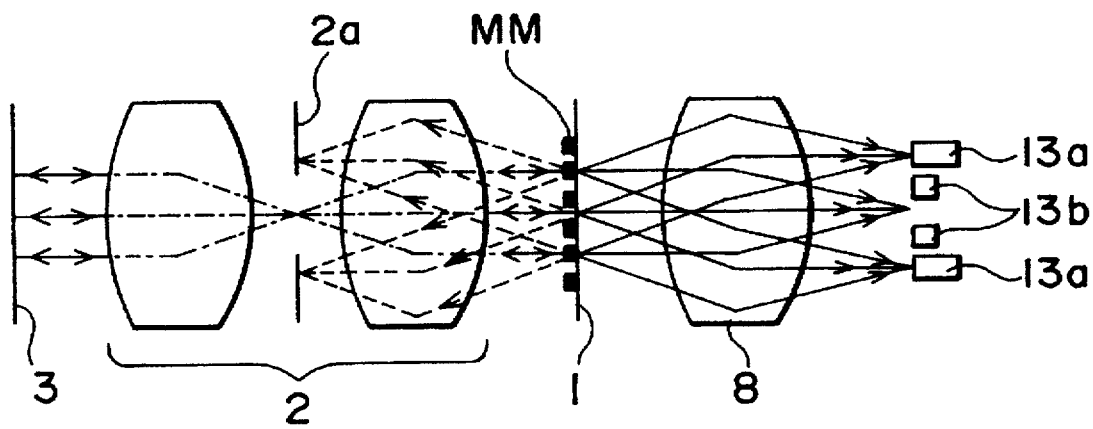
FIGS. 3 and 4 are drawings explaining paths of reflected and transmitted light components diffracted by a mask mark.
Figure 4:
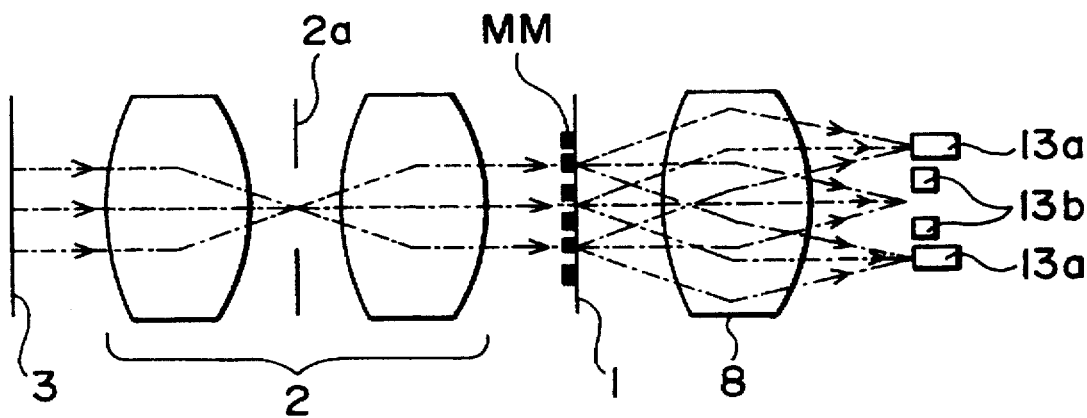
Figure 5:
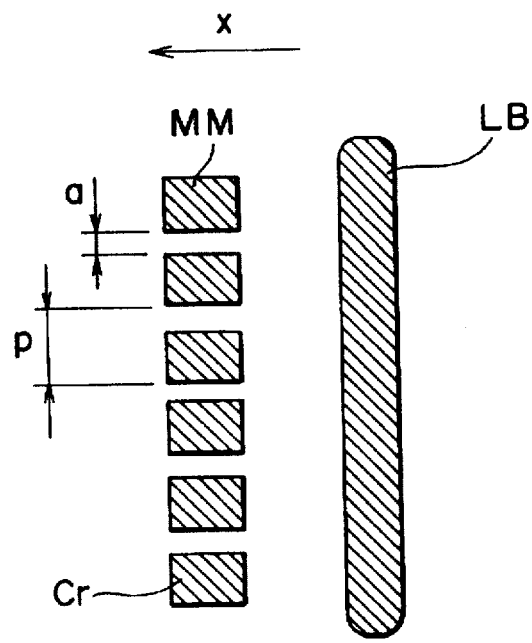
FIG. 5 is a drawing explaining constitutions of a mask mark and a scan beam.
Figure 6:
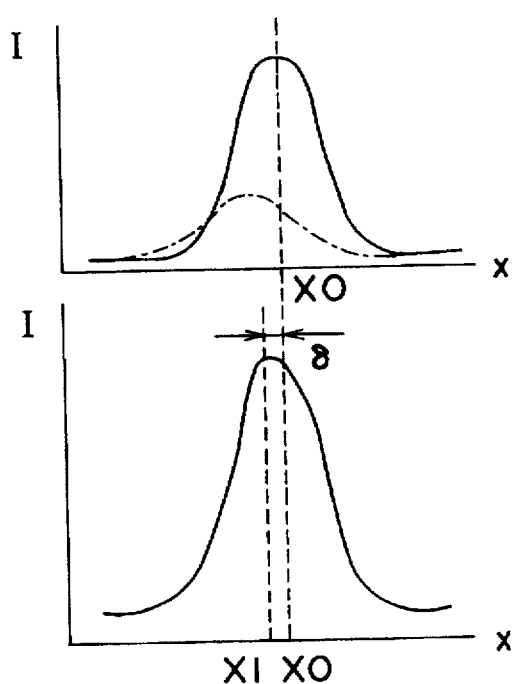
FIG. 6 is a drawing explaining unfavorable influence of light from a plate on positional detection of a mask.

FIGS. 3 and 4 are drawings explaining paths of the reflected and transmitted light components diffracted by the mask mark. Also, FIG. 5 is a drawing explaining the constitutions of the mask mark and scan beam. Further, FIG. 6 is a drawing explaining unfavorable influence of light from the plate on positional detection of the mask.

In the mask mark MM, as shown in FIG. 5, light-shielding portions Cr made of chromium, for example, are arranged in the longitudinal direction of a scan beam LB. As the scan beam LB moves in the direction of the arrow (i.e., x-direction) in the drawing, the mask mark MM is optically scanned therewith. The reflected and diffracted light component from the mask mark MM comprising such a grating-like mark is guided to a spatial filter 13a by way of the objective lens 8 as indicated by continuous line in FIG. 3.

On the other hand, as indicated by broken line in FIG. 3, the diffracted and transmitted light component passing through the mask 1 is blocked by an aperture stop 2a disposed within the projection optical system 2 and does not reach the plate 3. Namely, the pitch of the grating-like mask mark has been selected such that the sine value of the diffraction angle of the ±1-order diffracted light component from the mask mark is greater than the numerical aperture of the projection optical system.

In the following, the relationship between the numerical aperture $N_T$ of the projection optical system and the mark pitch p (cf. FIG. 5) of the mask mark MM will be briefly explained.

With respect to the alignment light (having a wavelength of $\lambda$) incident on the mask 1 in the normal direction of the mask 1, both diffracted and transmitted light component and diffracted and reflected light component from the mask mark MM are diffracted by a diffraction angle $\theta$ defined by the following expression (1):

$$\sin^{-1}\theta = m\lambda/p (m=1, 2, 3, \ldots) \qquad (1)$$

Accordingly, in order for the transmitted ±1-order diffracted light component to be blocked by the projection optical system 2, the condition indicated by the following expression (2) is satisfied:

$$NA_T < \lambda/p \qquad (2)$$

For example, assuming that the numeric aperture $NA_T$ of the projection optical system is 0.1 and the wavelength $\lambda$ of the alignment light from a He—Ne laser is 0.6328 μm, expression (2) can be modified as the following expression (3):

$$p < 6.328^\mu m \qquad (3)$$

In view of equation (3), when the pitch p of the mark MM formed on the mask 1 is made smaller than 6.328 μm, the diffracted and transmitted light component from the mask mark MM is blocked by the projection optical system 2 and does not reach the plate 3. As a result, as indicated by alternate long and short dash line in FIG. 3, only the zero-order transmitted light component which passes through the mask mark MM without being diffracted thereby reaches the plate 3.

As indicated by alternate long and short dash line in FIG. 4, the zero-order transmitted light component reflected by the plate 3 impinges on the mask mark MM by way of the projection optical system 2. In this manner, the transmitted light component which has been diffracted by the mask mark MM with respect to the light from the plate 3 reaches the spatial filter 13a by way of the objective lens 8. Namely, together with the reflected light component diffracted by the mask mark MM (indicated by continuous line in FIG. 3), i.e., original alignment-detecting light component, the diffracted and transmitted light component (indicated by alternate long and short dash line in FIG. 4) with respect to the light from the plate is detected at the spatial filter 13a.

Thus, there may be cases where the spatial filter 13a detects the diffracted and transmitted light component with respect to the light from the plate in addition to the diffracted and reflected light component from the mask mark MM, which is the original alignment-detecting light component, thereby erroneously detecting the mask position. This erroneous positional detection caused by the mingling diffracted and transmitted light component with respect to the light from the plate will be explained with reference to FIG. 6.

In the upper graph of FIG. 6, the intensity distribution of the diffracted and reflected light component from the mask mark MM, which is the original alignment-detecting light component, and that of the diffracted and transmitted light component with respect to the light from the plate are indicated by continuous line and alternate long and short dash line, respectively.

In the lower graph of FIG. 6, on the other hand, the intensity distribution of the combined light made of the diffracted and reflected light component and diffracted and transmitted light component is indicated by continuous line. Actually, the spatial filter 13a detects the diffracted and transmitted light component with respect to the light from the plate as a form mingling with the diffracted and reflected light component from the mask mark MM, i.e., the combined light indicated in the lower graph of FIG. 6.

As indicated by the upper graph of FIG. 6, the intensity peak of the diffracted and reflected light component, which is the original alignment-detecting light component, is at a position of $X_0$. However, the intensity peak of the diffracted and transmitted light component with respect to the light from the plate does not coincide with the position of $X_0$. Accordingly, as indicated by the lower graph of FIG. 6, the peak of the combined light moves to a position of $X_1$ when the diffracted and transmitted light component with respect to the light from the plate mingles therewith. As a result, the mask position is erroneously detected as being deviated by $\delta$.

Therefore, in this embodiment, the intensity of the diffracted and transmitted light component with respect to the light from the plate is sufficiently lowered so as to minimize the erroneous detection such as that mentioned above.

In the following, the ratio of the intensity of the diffracted and transmitted light component with respect to the light from the plate to the intensity of the diffracted and reflected light component from the mask mark MM, which is the original alignment-detecting light component, will be explained.

The following is the case where only the ±1-order light component from the mask 1 is received. In this case, assuming that the duty ratio of the mask mark MM is a/p as shown in FIG. 5 and the intensity of the incident alignment light is 1, the intensity $I_R$ of the first-order diffracted and reflected light component is indicated by the following expression (4):

$$I_R = \{(1/\pi)\cdot\sin(1-a/p)^\pi\}^2 \qquad (4)$$

On the other hand, the intensity $I_P$ of the zero-order transmitted light component is indicated by the following expression (5):

$$I_P = (a/p)^2 \qquad (5)$$

The intensity $I_T$ of the first-order diffracted and transmitted light component diffracted by the mask mark with respect to the above-mentioned zero-order transmitted light component is indicated by the following expression (6):

$$I_T = (a/p)^2 \cdot \{(1/\pi)\sin(a/p)\}^2 \qquad (6)$$

Accordingly, assuming that the reflectivity of the mask mark is $R_{CR}$, the (reciprocating) transmittance of the projection optical system is $\tau$, and the reflectivity of the plate is $R_P$, the ratio $R = I_R/I_T$ of the intensity $I_R$ of the first diffracted and reflected light component with respect to the intensity $I_T$ of the first diffracted and transmitted light component is indicated by the following expression (7):

$$R = R_{CR}/\{(a/p)^{2\cdot\tau} R_P\} \qquad (7)$$

Here, assuming that $R_{CR}=50\%$, $\tau=50\%$, $R_P=80\%$, and the duty ratio a/p=1/2, the ratio R of the intensity $I_R$ of the first diffracted and reflected light component with respect to the intensity $I_T$ of the first diffracted and transmitted light component becomes 20 in view of equation (7).

Thus, when the duty ratio of the grating-like mark constituting the mask mark is about ¼, the intensity of the first diffracted and reflected light component from the mask, which is the original alignment-detecting light component, becomes about 20 times that of the first diffracted and transmitted light component from the mask with respect to the light from the plate and then is detected at the spatial filter 13a. In the above-mentioned example of calculation, the reflectivity of the plate $R_P=80\%$ is assumed for that of aluminum (Al). Namely, cases of specific layers in actual liquid crystal devices or the like are assumed.

In this manner, unfavorable influence of the light from the plate can be minimized when the duty ratio of the grating-like mark constituting the mask mark is appropriately selected.

Figure 7:
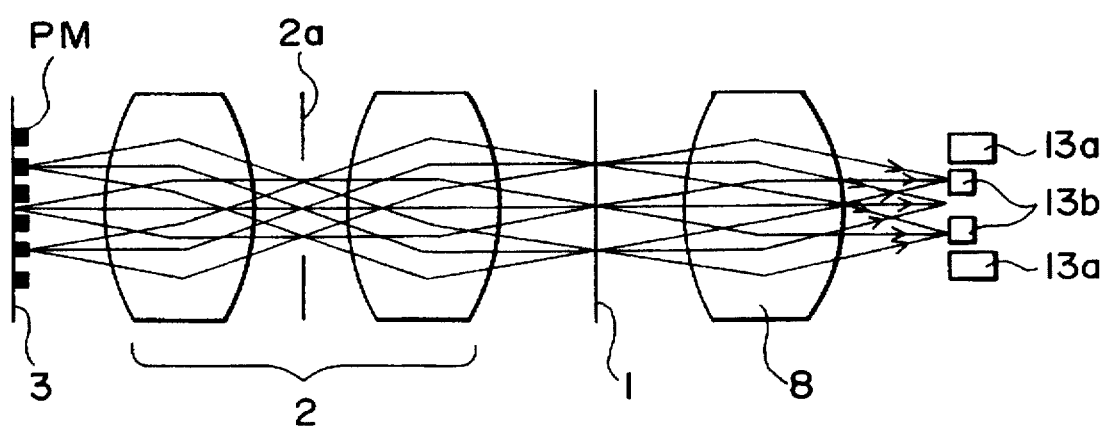
FIG. 7 is a drawing explaining paths of reflected light components diffracted by a plate mark.

FIG. 7 is a drawing explaining the path of the reflected light component diffracted by a plate mark.

As indicated by FIG. 7, the ±1-order reflected light component diffracted by a grating-like plate mark PM formed on the plate 3 reaches a spatial filter 13b by way of the projection optical system 2, the mask 1, and the objective lens 8. In this case, the pitch of the grating-like plate mark PM has been selected such that the sine value of the diffraction angle of the ±1-order diffracted light component from the plate mark PM is smaller than the numerical aperture of the projection optical system, i.e., the ±1-order diffracted light component from the plate 3 passes through the aperture stop 2a. Accordingly, the diffracted and reflected light component from the plate mark PM passes through a path different from the path of the diffracted and reflected light component from the mask mark MM and then is photoelectrically detected by the spatial filter 13b which is different from that detecting the diffracted and reflected light component from the mask mark MM.

Thus, in this embodiment, the alignment-detecting light component from the mask and that from the plate are spatially separated from each other and optically detected by respective spatial filters. Accordingly, electrically optimal gains can be respectively adjusted with respect to the signal based on the alignment-detecting light component from the mask and that based on the alignment-detecting light component from the plate. Also, since the diffracted and transmitted light component from the mask mark is blocked so as not to reach the plate, the influence of the light from the plate on the positional detection of the mask can be reduced. As a result, highly accurate alignment becomes possible.

Further, when the duty ratio of the grating-like mark constituting the mask mark is appropriately selected, the light passing through the mask, without being diffracted thereby, to reach the plate can be reduced. As a result, unfavorable influence of the light from the plate on the positional detection of the mask can be minimized.

In the above-mentioned first embodiment, the laser-emitting optical system for forming the scan beam and the light-receiving optical system for receiving the diffracted light from the mark commonly use the objective lens 8. However, the light-receiving optical system may receive the diffracted light component not always through the objective lens 8 but also by way of the outside thereof.

Also, the interference of the light returning from the mask and that returning from the plate with each other is not problematic when the distance between the mask and the plate is longer than the coherence distance of the light from the light source. Accordingly, for example, when an interference occurs with a He—Ne laser, a semiconductor lens or the like may be suitably used instead.

Figure 8:
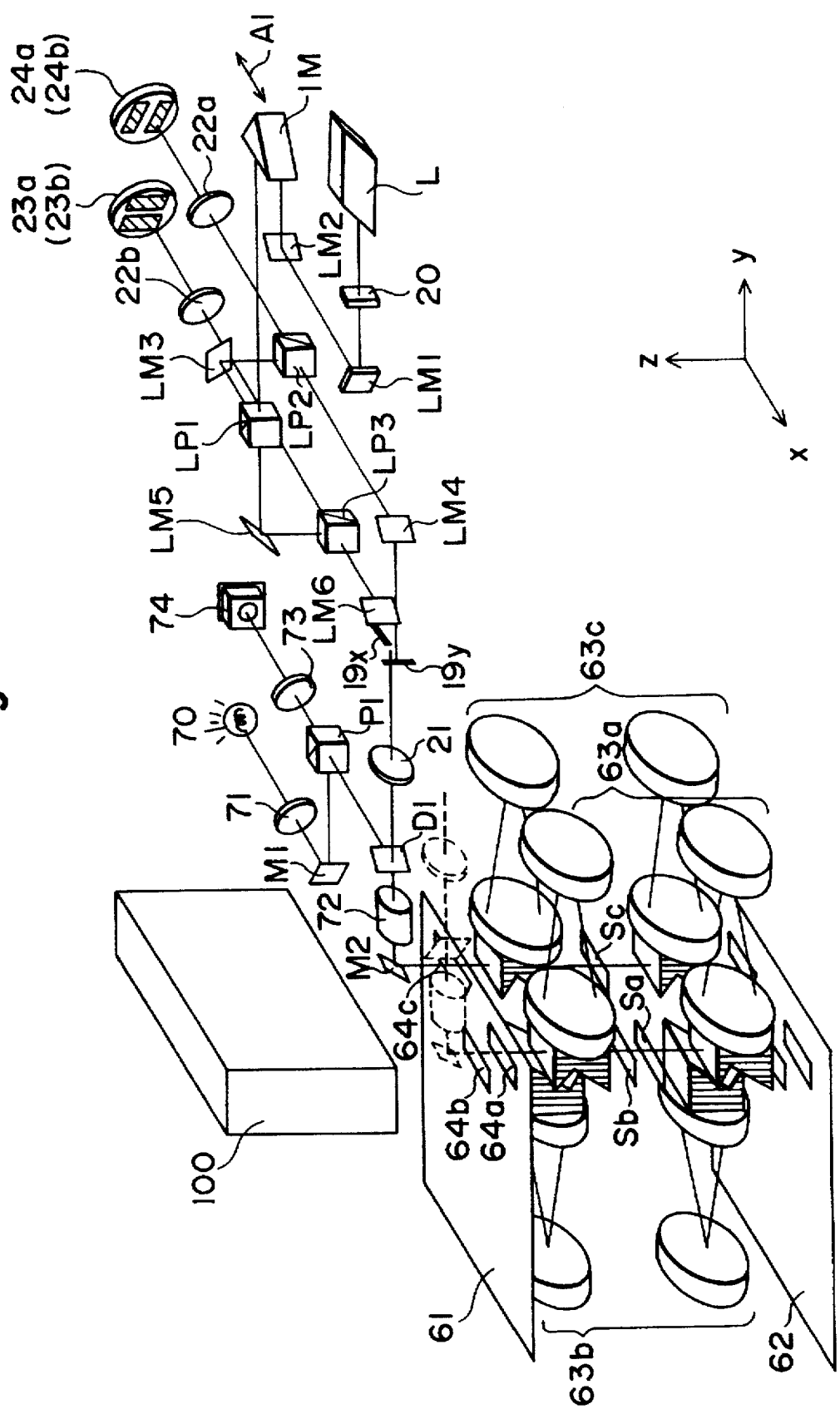
FIG. 8 is a perspective view showing the constitution of an exposure apparatus in accordance with the second embodiment of the present invention.

FIG. 8 is a perspective view showing the constitution of an exposure apparatus in accordance with the second embodiment of the present invention. In the second embodiment, the present invention is applied to a so-called scanning type exposure apparatus in which a mask and a plate are unitedly moved relative to a projection optical system comprising a plurality of projection optical units. Namely, while only its projection optical system and alignment optical system structurally differ from those of the first embodiment, the alignment-detecting light component from the mask and that from the plate are spatially separated from each other in accordance with the constitution shown in the first embodiment.

In the apparatus of FIG. 8, y-direction refers to a direction in which a mask 61, in which a predetermined circuit pattern has been formed, and a plate 62, which comprises a glass substrate and a resist coated thereon, are unitedly moved; x-direction refers to a direction orthogonal to the y-direction within the plane of the mask 61; and z-direction refers to the normal direction with respect to the plane of the mask 61.

In FIG. 8, the exposure light from an illumination optical system 100 uniformly illuminates the mask 61. Then, parts of the pattern formed at visual field areas 64a to 64c in the mask 61, which are defined by field stops Sa to Sc, are transferred to exposure areas on the plate 62 by way of same-magnification erect projection optical systems 63a to 63c, respectively. Accordingly, when the mask 61 and the plate 62 are exposed to the light while being unitedly moved in the y-direction relative to the projection optical systems 63a to 63c, the whole pattern area can be transferred to the whole exposure area of the plate in a single scanning exposure operation.

As depicted, each of the projection optical systems 63a to 63c has a constitution in which two Dyson type optical systems are serially connected together in the z-direction.

Also, the apparatus of FIG. 8 has an alignment optical system for performing two-dimensional alignment of the mask 61 and the plate 62 with respect to each other in the xy-plane. In the alignment optical system, by way of the projection optical systems 63a and 63c respectively disposed at both ends in the direction (i.e., x-direction) orthogonal to the scanning direction, the relative positions of the mask mark and plate mark with respect to each other are detected.

FIG. 8 shows the overall constitution of the first alignment optical system corresponding to the visual field area 64c (and the projection optical system 63c), while indicating, with broken line, only a part of the second alignment optical system corresponding to the visual field area 64a (and the projection optical system 63a). Since the two alignment optical systems are constructed identical to each other, only the constitution of the first alignment optical system will be explained in the following.

The depicted alignment optical system has an observation optical system for observing the mask mark and the plate mark. In the observation optical system, light emitted from a photo-insensitive observation light source 70 made of, for example, mercury lamp, halogen lamp, LED, or the like passes through an illumination condenser lens 71 and then is reflected by a mirror M1 so as to enter a split prism P1. The light component reflected by the split prism P1 is reflected by a dichroic mirror D1 so as to enter a first objective lens 72. The light component passing through the first objective lens 72 is reflected by a drop mirror M2 so as to illuminate a mask mark within the visual field area 64c on the mask 1. The light component which has illuminated the mask mark further illuminates a plate mark on the plate 62 by way of the projection optical system 63c.

The light component which has reached the plate mark returns to the mask 61 by way of the projection optical system 63c again. Further, it enters the split prism P1 by way of the drop mirror M2, the first objective lens 72, and the dichroic mirror D1. The light component passing through the split prism P1 forms, by way of a second observation objective lens 73, an image on an image pickup element 74 such as a CCD.

On the other hand, the light component from the mask mark with respect to the light from the observation light source 70 enters the split prism P1 by way of the drop mirror M2, the first objective lens 72, and the dichroic mirror D1. The light component passing through the split prism P1 forms, by way of the second observation objective lens 73, an image on the CCD 74.

In this manner, both images of the mask mark and plate mark can be simultaneously observed by the observation optical system and, based on an image processing, the relative positions of the mask mark and the plate mark with respect to each other can be detected.

Also, the alignment optical system has a scanning optical system for two-dimensionally scanning the mask mark and the plate mark with a linear beam. In the scanning optical system, alignment light emitted in the y-direction from a laser light source L such as a He—Ne laser, a semiconductor laser, or the like becomes, by way of a cylindrical lens 20, a linear beam extending in the z-direction. By way of two laser mirrors LM1 and LM2, the beam passing through the cylindrical lens 20 impinges on a movable mirror IM made of, for example, a rectangular prism.

The beam incident on the movable mirror IM is polarized, with an angle of 180 degrees, by its two reflective surfaces which are orthogonal to each other and then is emitted in parallel to the incident beam. The movable mirror IM is, for example, fixed on a table (not depicted) which is in parallel to the xy-plane, while the table is constructed so as to be reciprocatively movable in the x-direction as indicated by an arrow $A_1$ in the drawing.

Thus, due to the condensing action of the abovementioned cylindrical lens 20, the beam emitted from the movable mirror IM forms an image as a linear beam. As the table moves in the x-direction, i.e., as the movable mirror IM moves in the x-direction, the linear beam moves in the x-direction (i.e., in parallel dislocation).

The light from the linear beam enters the split prism LP1 and then is divided into two beams. Namely, a first beam passing through the split prism LP1 forms an image as a linear beam 19x, whose longitudinal direction extends in the x-direction (i.e., direction of refracting power of the cylindrical lens 20), by way of a laser mirror LM5, a split prism LP3, and a laser mirror LM6.

Also, a second beam reflected by the split prism LP1 forms an image as a linear beam 19y, whose longitudinal direction extends in the z-direction, by way of a laser mirror LM3, a split prism LP2, and a laser mirror LM4.

As depicted, the longitudinal directions of the two linear beams 19x and 19y are orthogonal to and spatially separated from each other. Namely, the centers of the two linear beams 19x and 19y are individually deviated from the optical axis of a second objective lens 21 which will be explained later.

The light components from the two linear beams 19x and 19y respectively form images on the surface of the mask 61 as an x-direction scan beam and a y-direction scan beam by way of the second objective lens 21, the dichroic mirror D1, the first objective lens 72, and the drop mirror M2.

The x-direction scan beam is a linear beam whose longitudinal direction extends in the x-direction, whereas the y-direction scan beam is a linear beam whose longitudinal direction extends in the y-direction. As the movable mirror IM reciprocatively moves in the x-direction, the x-direction scan beam moves in the y-direction to scan the mask mark in the x-direction while the y-direction scan beam moves in the x-direction to scan the mask mark in the y-direction.

On the other hand, the light components from the x-direction scan beam and y-direction scan mark respectively form images as an x-direction scan beam and a y-direction scan beam on the surface of the plate 62 by way of the projection optical system 63c.

As mentioned above, the projection optical system 63c is constructed so as to form, on the plate 62, a same-magnification erected image of the mask pattern. Accordingly, also on the plate 62, the x-direction scan beam is a linear beam whose longitudinal direction extends in the x-direction, whereas the y-direction scan beam is a linear beam whose longitudinal direction extends in the y-direction. As the movable mirror IM reciprocatively moves in the x-direction, the x-direction scan beam moves in the y-direction to scan the plate mark in the x-direction while the y-direction scan beam moves in the x-direction to scan the plate mark in the y-direction. The amount of movement of a scan beam on the mask 61 accompanying the reciprocative movement of the movable mirror IM in the x-direction equals to the amount of movement of a scan beam on the plate 62.

The first diffracted light component from the mask mark in the x-direction with respect to the x-direction scan beam enters the split prism LP3 by way of the drop mirror M2, the first objective lens 72, the dichroic mirror D1, the second objective lens 21, and the laser mirror LM6.

Also, the second diffracted light component from the mask mark in the y-direction with respect to the y-direction scan beam enters the split prism LP2 by way of the drop mirror M2, the first objective lens 72, the dichroic mirror D1, the second objective lens 21, and the laser mirror LM4.

The first diffracted light component passing through the split prism LP3 reaches, by way-of a pupil relay lens 22b, a photodetector 23a such as a spatial filter, which is disposed at a position conjugate with the pupil surface of the first objective lens 72, and then is photoelectrically detected. Also, the second diffracted light component passing through the split prism LP2 reaches, by way of a pupil relay lens 22a, a photodetector 24a, which is disposed at a position conjugate with the pupil surface of the first objective lens 72, and then is photoelectrically detected.

On the other hand, the third diffracted light component from the plate mark in the x-direction with respect to the x-direction scan beam enters the split prism LP3 by way of the projection optical system 63c, the drop mirror M2, the first objective lens 72, the dichroic mirror D1, the second objective lens 21, and the laser mirror LM6.

Also, the fourth diffracted light component from the plate mark in the y-direction with respect to the y-direction scan beam enters the split prism LP2 by way of the projection optical system 63c, the drop mirror M2, the first objective lens 72, the dichroic mirror D1, the second objective lens 21, and the laser mirror LM4.

The third diffracted light component passing through the split prism LP3 reaches, by way of a pupil relay lens 22b, a photodetector 23b, which is disposed at a position conjugate with the pupil surface of the first objective lens 72, and then is photoelectrically detected.

Also, the fourth diffracted light component passing through the split prism LP2 reaches, by way of a pupil relay lens 22a, a photodetector 24b, which is disposed at a position conjugate with the pupil surface of the first objective lens 72, and then is photoelectrically detected.

Here, the alignment optical system is relatively movable with respect to the projection optical system so that the alignment light can impinge on an arbitrary point within the visual field area 64c on the mask 61. Accordingly, the position of the mask mark can be arbitrarily selected within the visual field area 64c.

Further, the apparatus of FIG. 7 has a measurement means (not depicted) for measuring the amount of movement Δ of the movable mirror IM in the x-direction. As such a measurement means, for example, an interferometer, a laser scale, an encoder, or the like can be used.

In this manner, when the amount of movement Δ of the movable mirror IM in the x-direction is measured, the amount of parallel dislocation of the linear beam by the movable mirror IM and, accordingly, the amount of movement of the scan beam can be accurately determined on the basis of thus measured amount. Namely, the scanning position can be accurately determined, thereby performing a highly accurate beam scan.

Thus, in the above-mentioned second embodiment, the alignment-detecting light component from the mask mark and that from the plate mark are spatially separated from each other so as to be photoelectrically detected by respective detectors (e.g., 23a and 23b), while the alignment-detecting light component from the marks in the x-direction and that from the marks in the y-direction are spatially separated from each other on the mask and the plate so as to be photoelectrically detected by respective detectors (e.g., 23a and 24a; 23b and 24b).

In this manner, in the above-mentioned second embodiment, the mask and the plate can be two-dimensionally aligned with each other at the same time with accuracy in a single optical scanning operation.

While a TTM type alignment optical system is shown in the above-mentioned embodiments, the present invention may also be applied, for example, to an off-axis type alignment optical system, in which an optical system capable of simultaneously observing the mask and the plate is provided separately from the projection optical system.

Also, when a projection optical system having an aperture stop with a large aperture therein, i.e., projection optical system having a high resolution, is used, the size of the aperture of the aperture stop is preferably made variable. In this case, the size of the aperture of the aperture stop may be reduced at the time of alignment (i.e., positioning) so as to block the transmitted and diffracted light component from the mask whereas it is increased at the time of exposure so as to improve the resolution of the projection optical system.

In general, each projection optical system is designed in reference to the exposure wavelength such that the mask 61 and the plate 62 are in their best focuses with respect to the exposure light. Nevertheless, though depending on the wavelength of the alignment light, even an exposure apparatus in which the projection optical system is constituted by two sets of so-called Dyson type optical systems with little chromatic aberration may actually yield more than 10 μm to about 100 μm of axial chromatic aberration.

Also, since the alignment position is movable within the exposure field, not only the chromatic aberration but the fluctuation of image surface in the projection optical system due to difference in wavelength between the exposure light and alignment light has to be taken into account.

Further, telecentric collapse with respect to the alignment light differs from that with respect to the exposure light. Accordingly, the amount of collapse with respect to the alignment light inevitably becomes greater than that with respect to the exposure light wavelength.

In the following, the fluctuation of image surface and the telecentric collapse will be explained with reference to FIGS. 9 to 13.

Figure 9:
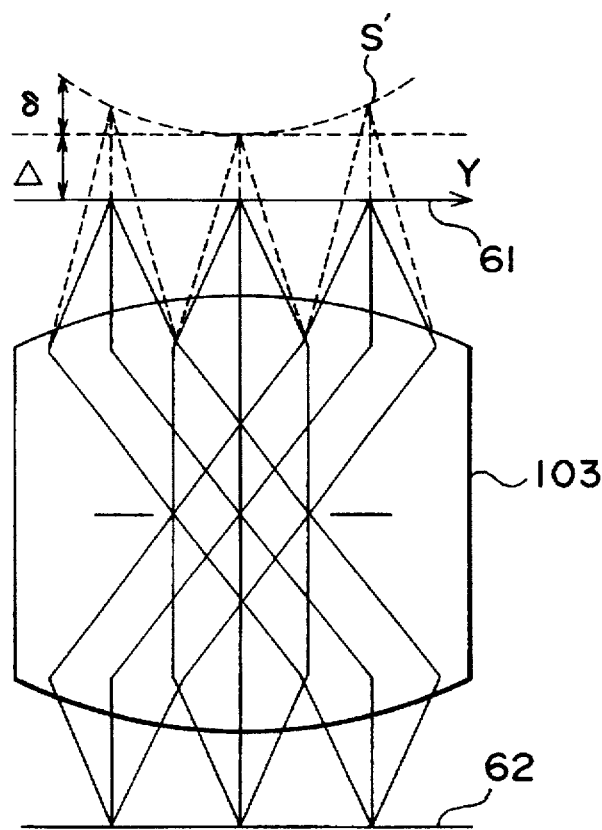
FIGS. 9 and 10 are drawings showing fluctuation of an image surface of a projection optical system due to difference in wavelength.
Figure 10:
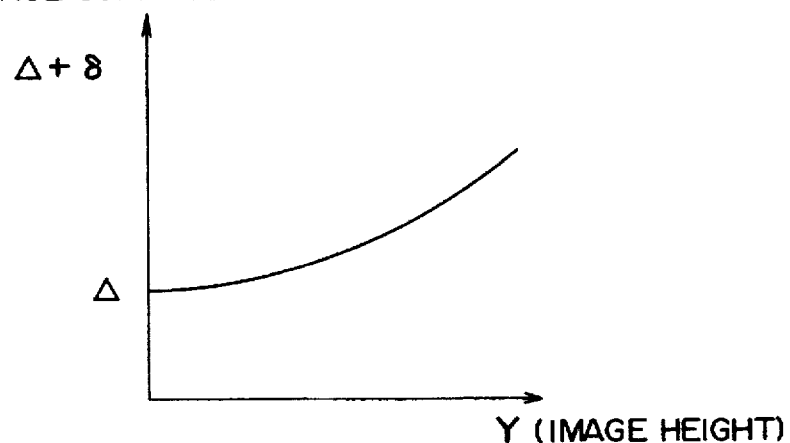

FIGS. 9 and 10 are drawings showing the fluctuation of image surface in a projection optical system due to difference in wavelength. In FIG. 9, continuous line and broken line indicate the exposure light and the alignment light, respectively.

In FIG. 9, the axial chromatic aberration of the projection optical system 103 with respect to the alignment light is indicated by Δ, whereas the image surface with respect to the alignment light is indicated by S'. Also, FIG. 10 shows change of the distance (Δ+δ) between the mask and the image surface S' with respect to an image height Y of the projection optical system 103.

In this manner, when a plate 62 or a mask 61 is moved, in response to the alignment position, in the direction of the optical axis of the projection optical system 103 by the sum of the axial chromatic aberration Δ and the image surface difference δ, the plate 62 and the mask 61 can be positioned at their best focus positions with respect to the alignment optical system.

Figure 11:
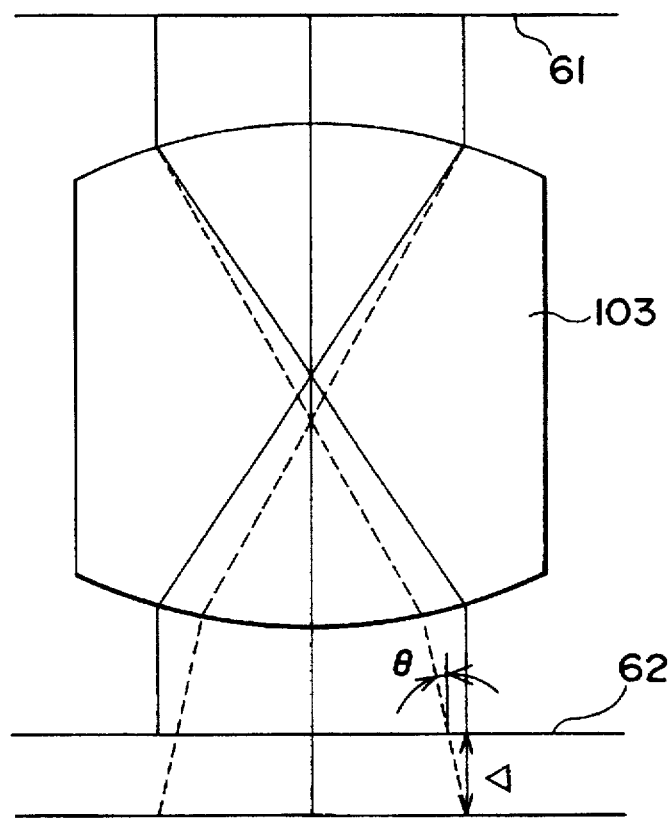
FIGS. 11 and 12 are drawings showing telecentric collapse of a projection optical system due to difference in wavelength.
Figure 12:
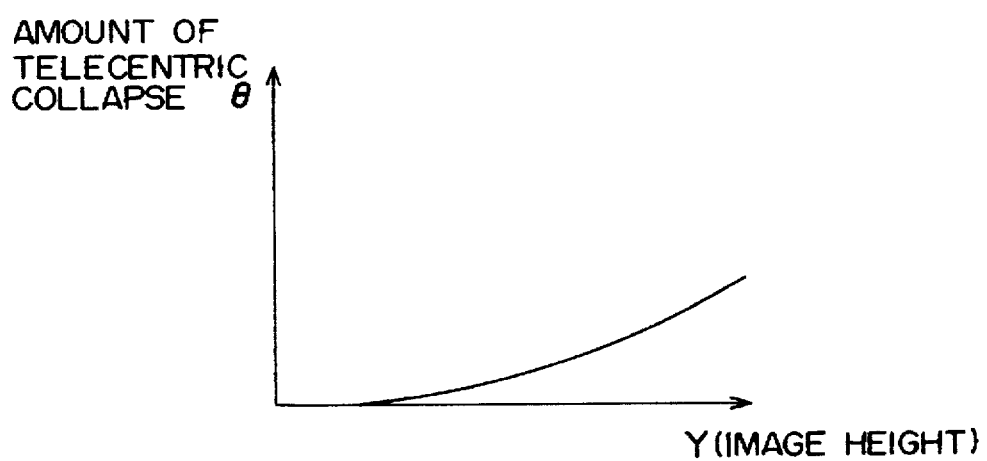

FIGS. 11 and 12 are drawings showing the telecentric collapse in a projection optical system due to difference in wavelength. In FIG. 11, continuous line and broken line indicate the exposure light and the alignment light, respectively. FIG. 12 shows change in the amount of telecentric collapse θ with respect to the image height Y of the projection optical system 103.

As depicted, the projection optical system 103 is a so-called double-sided telecentric optical system which is telecentric with respect to the exposure light wavelength on both sides of the mask 61 and plate 62. It is understood that the amount of telecentric collapse θ changes, depending on the image height Y of the projection optical system 103, due to the difference in wavelength between the exposure light and the alignment light.

Figure 13:
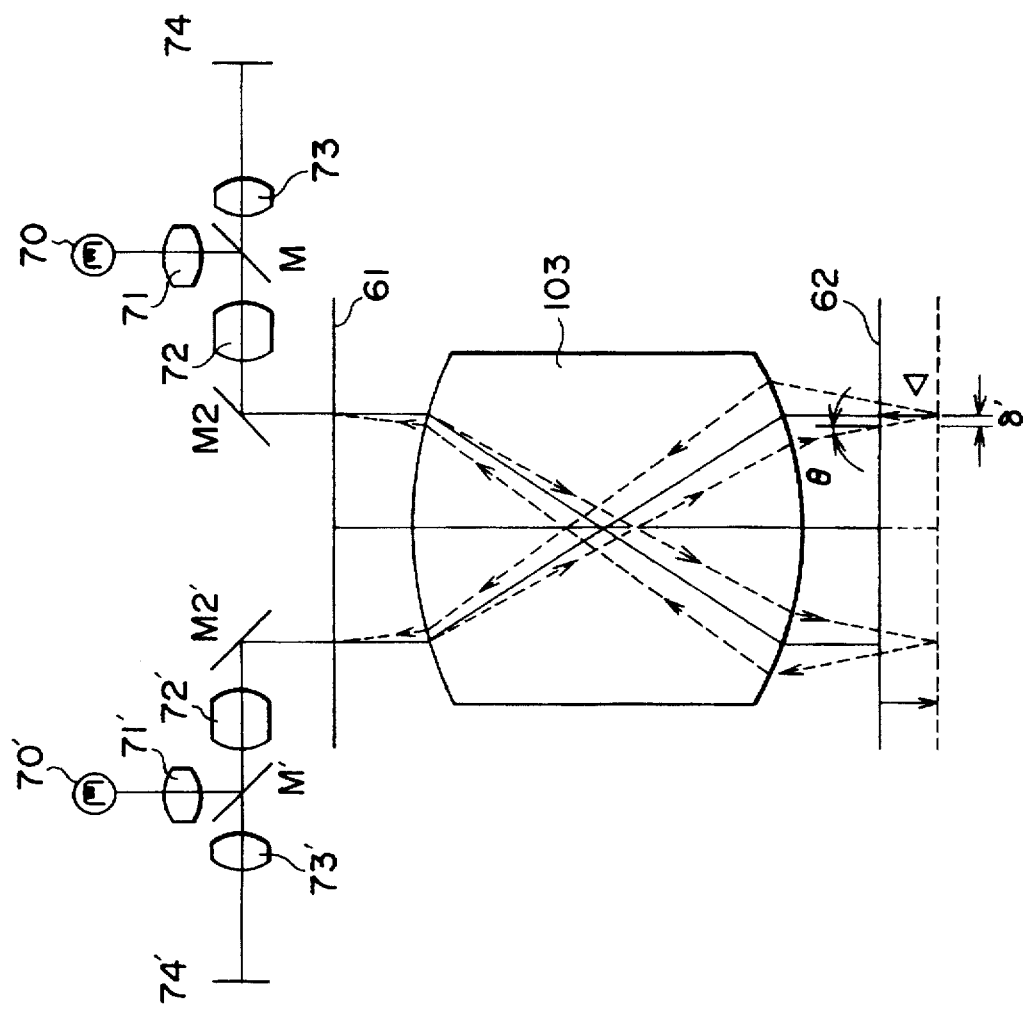
FIG. 13 is a drawing showing a relationship between telecentric collapse of a projection optical system and the best focus position at a measurement position of an alignment system.

FIG. 13 is a drawing showing the relationship between the telecentric collapse of a projection optical system and the difference in the best focus position at an alignment position. FIG. 13 shows a pair of alignment systems having basically the same constitution as that of the observation optical system in the alignment optical system of FIG. 8.

In FIG. 13, alignment illumination light from an alignment light source 70 (70') illuminates a mask 61 by way of a condenser lens 71 (71'), a mirror M (M'), a first objective lens 72 (72'), and a drop mirror M2 (M2') and further illuminates a plate 62 by way of a projection optical system 103.

In this case, as depicted, the telecentricity with respect to the alignment light collapses by θ on the plate 62. Then, due to the difference in wavelength between the exposure light (indicated by continuous line in the drawing) and the alignment light (indicated by broken line in the drawing), at the alignment position, the best focus position with respect to the alignment light deviates in the direction of the optical axis of the projection optical system 103 by Δ' from the best focus position with respect to the exposure light.

Namely, when converted on the side of the plate 62, the amount of positional deviation δ' due to the telecentric collapse is provided by the following expression (8):

$$\delta'=\Delta'\theta \tag{8}$$

In other words, this positional deviation δ, is cancelled when the plate 62 is moved in the direction of the optical axis of the projection optical system 103 by Δ so as to place the plate 62 at its best focus position.

In the alignment system, the light components from the mask mark and plate mark with respect to the illumination light form images on a CCD 74 by actions of the first objective lens 72 and the second objective lens 73. Then, the relative positional deviation between the mask mark and the plate mark can be detected by an image processing.

The conventional auto-focus system is fixed to an exposure apparatus such that, for example, only the position in the z-direction (i.e., direction of the optical axis of the projection optical system) at the center point (i.e., single point) of an exposure field is read out. Accordingly, it is impossible for the conventional auto-focus system to measure the position in the z-direction at the alignment position which moves within the exposure field.

Therefore, in the present invention, the alignment optical system, by itself, has an auto-focus mechanism.

In the following, the auto-focus function of the alignment optical system by itself will be explained with reference to FIGS. 14 to 21.

Figure 14:
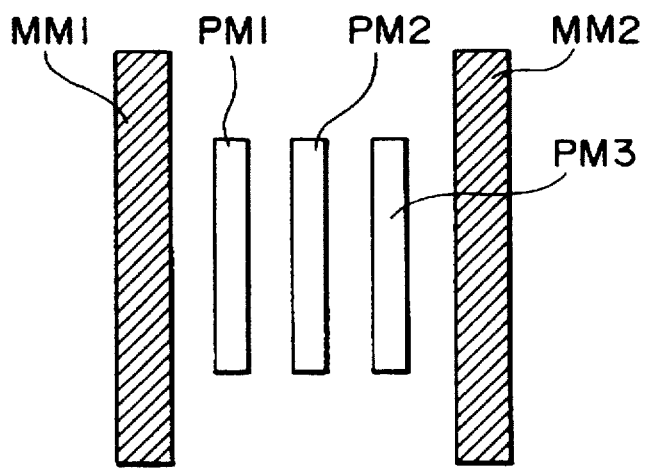
FIGS. 14 to 17 are drawings explaining an auto-focus function utilizing an observation optical system of an alignment optical system.
Figure 15:
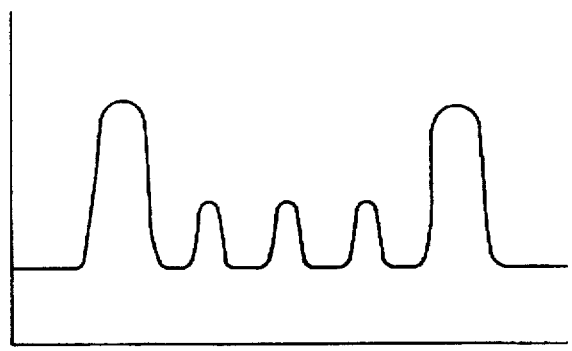
Figure 16:
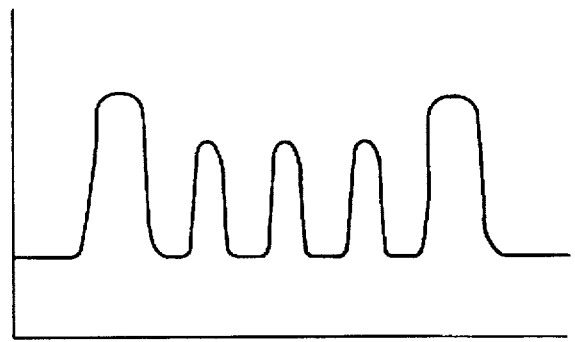
Figure 17:
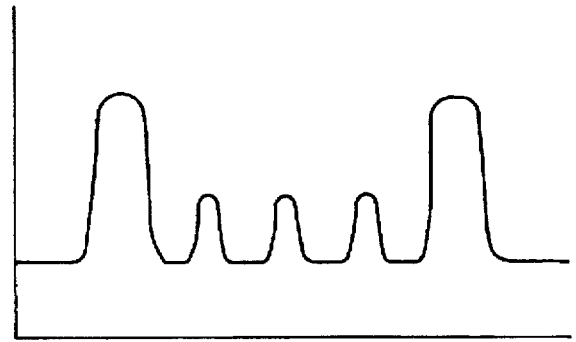

FIGS. 14 to 17 are drawings explaining the auto-focus function utilizing the observation optical system in the alignment optical system of FIG. 8. FIG. 14 shows images of mask marks MM1 and MM2 and plate marks PM1 to PM3 obtained by way of the CCD 74 in FIG. 8. Also, FIGS. 15 to 17 show output signals of the CCD 74 obtained in response to the mask marks MM1 and MM2 and the plate marks PM1 to PM3.

Here, FIGS. 15 to 17 show signals obtained when the plate 62 is moved, with a stage, in the z-direction under the condition where the alignment optical system is in focus with respect to the mask marks MM1 and MM2. Since the signal intensity of the plate marks PM1 to PM3 are peaked in FIG. 16, it is understood that, at this position of the plate 62 in the z-direction, the plate 62 is in its best focus with respect to the alignment optical system.

In this manner, based on the signal intensity obtained from the mask marks MM1 and MM2 and the plate marks PM1 to PM3 by way of the observation optical system of the alignment optical system, the mask 61 and the plate 62 can be individually positioned at their best focus positions at their alignment positions.

Figure 18:
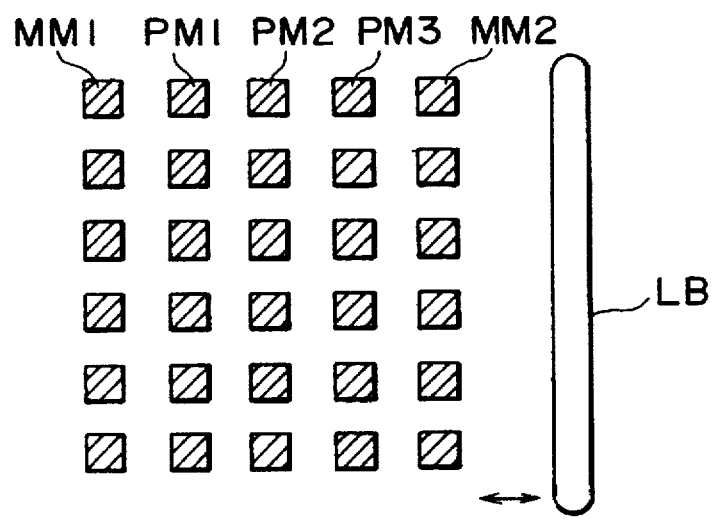
FIGS. 18 to 21 are drawings explaining an auto-focus function utilizing a scanning optical system of an alignment optical system.

FIGS. 18 to 21 are drawings explaining the auto-focus function utilizing the scanning optical system in the alignment optical system of FIG. 8. FIG. 18 shows the relationship between two grating-like marks MM1 and MM2 formed on a mask 61 and three grating-like marks PM1 to PM3 formed on a plate 62 and a scan beam LB with which these grating-like marks are optically scanned.

Figure 19:
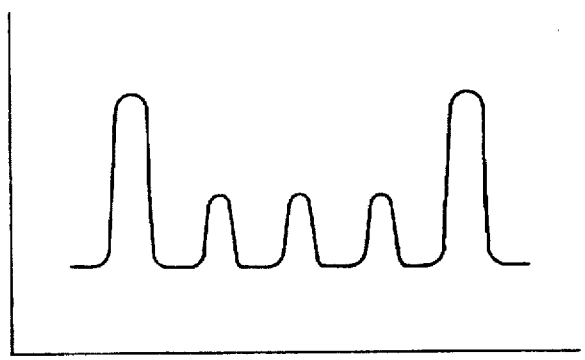
Figure 20:
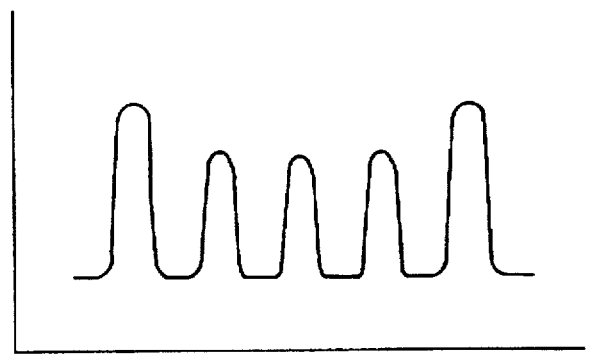
Figure 21:
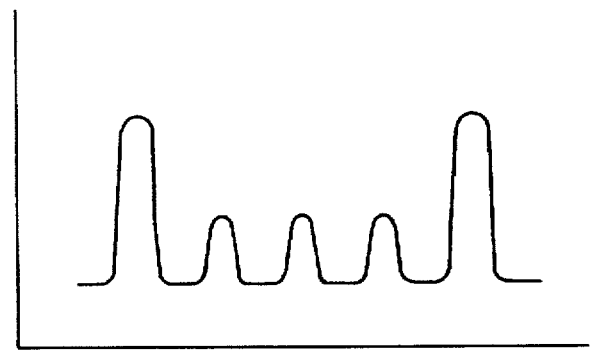

Also, FIGS. 19 to 21 show output signals of photodetectors 23a, 23b, 24a, and 24b obtained in response to the mask marks MM1 and MM2 and the plate marks PM1 to PM3.

Here, FIGS. 19 to 21 show signals obtained when the plate 62 is moved, with a stage, in the z-direction under the condition where the alignment optical system is in focus with respect to the mask marks MM1 and MM2. Since the signal intensity of the plate marks PM1 to PM3 are peaked in FIG. 20, it is understood that, at this position of the plate 62 in the z-direction, the plate 62 is in its best focus with respect to the alignment optical system.

In this manner, based on the signal intensity obtained from the mask marks MM1 and MM2 and the plate marks PM1 to PM3 by way of the observation optical system of the alignment optical system, the mask 61 and the plate 62 can be individually positioned at their best focus positions at their alignment positions.

Figure 22:
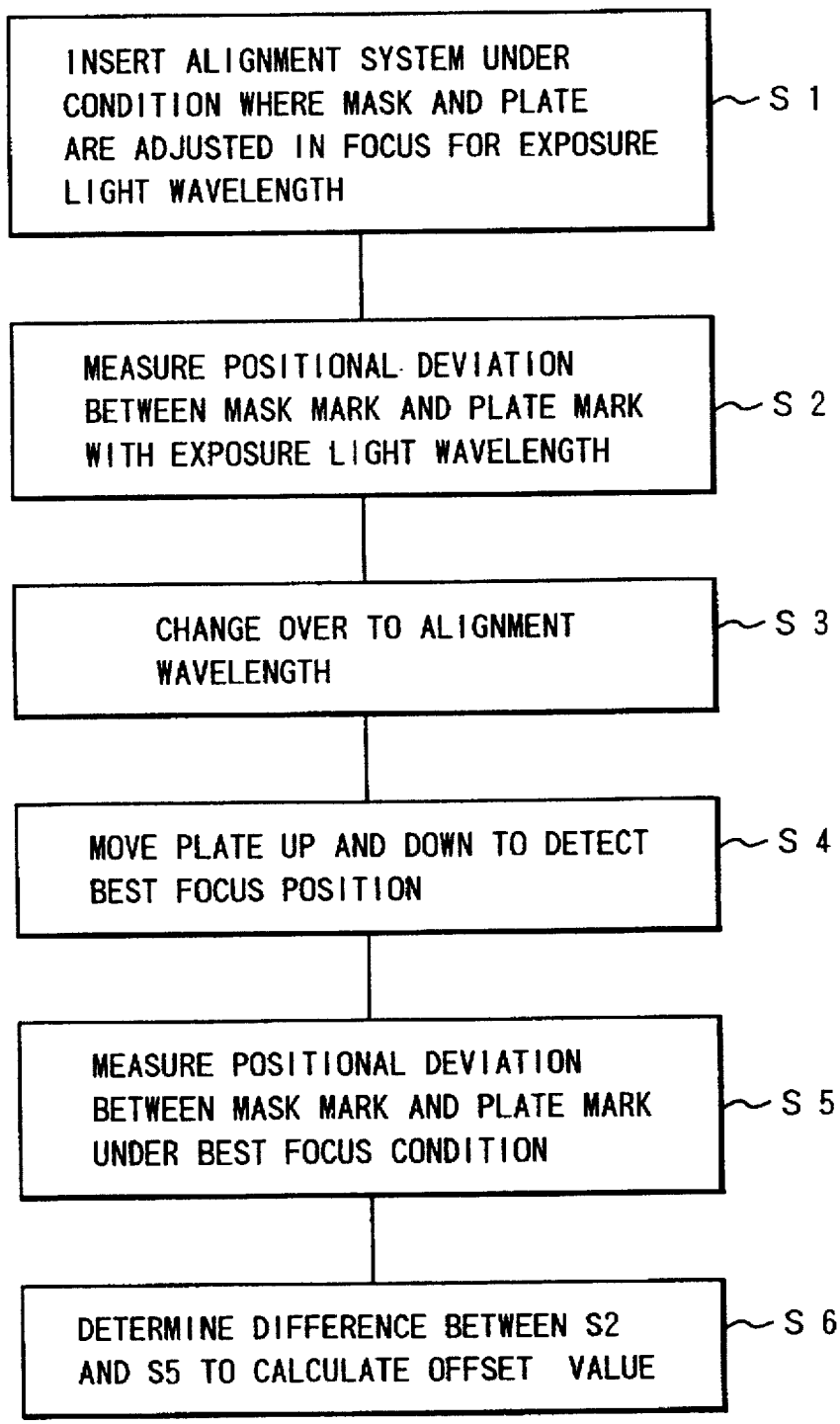
FIG. 22 is a flow chart explaining a method of calculating a correction value.

In the following, a method of calculating a correction value will be explained with reference to the flow chart of FIG. 22.

It is assumed that mask marks MM1 and MM2 and plate marks PM1 to PM3 have been adjusted so as to be in focus with a projection optical system for an exposure light wavelength. Under this condition, an alignment system is set to a predetermined image height of the projection optical system (step S1).

Then, a light component having the same wavelength as the exposure light component is supplied to the alignment system so as to measure positional deviations between the mask marks MM1 and MM2 and plate marks PM1 to PM3. For providing such a light component, the light from the exposure light source may be guided through optical fiber by way of a shutter or the like or a light source having the same spectroscopic characteristic may be separately provided (step S2).

Next, a light component having an alignment wavelength for actually effecting alignment is supplied to the alignment system. These supplied light components are changed over by changing wavelength-selecting filters, optical paths, or the like (step S3).

Under the condition where the light component having the alignment wavelength is supplied, the plate 62 is moved up and down so as to detect the best focus position on the side of the plate 62. This best focus position is stored (step S4).

At the above-mentioned best focus position, the positional deviation between the mask marks MM1 and MM2 and the plate marks PM1 to PM3 is measured (step S5).

The difference between the positional deviation between the mask marks MM1 and MM2 and the plate marks PM1 to PM3 measured at step S2 by using the exposure light wavelength and that measured at step S5 by using the alignment wavelength is determined and set as an offset value at the time of alignment (step S6).

The foregoing is the procedure for calculating the offset value at the time of alignment for a predetermined image height of the projection optical system. When this procedure is performed for a plurality of image heights in the projection optical system, offset values at the time of alignment are determined with reference to the image heights. When a software-like map is provided for storing thus determined offset values, it becomes possible to cancel errors in magnification, shifting, or the like which results from the difference in wavelength between the exposure light and the alignment light. Namely, at the time of actual alignment, the focus data obtained at step S4 are used to move the plate 62 up and down by an amount corresponding to a predetermined alignment mark position (i.e., image height of the projection optical system) and, at this position, the relative positions of a mark in the mask 61 and a mark in the plate 62 with respect to each other are measured. Then, the offset value obtained at step S6 is added thereto so as to obtain the relative positions of the mask 61 and the plate 62 with respect to each other at the actual exposure light wavelength.

In addition to the method in which the correction map is provided in this manner, there are methods in which the correction value obtained at step S6 is not used. For example, since the position of the alignment mark (i.e., image height of the projection optical system) is fixed for individual mask, there are a method in which steps S1 to S6 are performed only when a specific mask is loaded, a method in which only predetermined focus data are used to determine the offset amounts for individual masks and plates with a reference mark corresponding to the alignment mark position and then alignment is performed, and the like.

As explained in the foregoing, in accordance with the present invention, the best focus positions of the mask and the plate can be respectively obtained at their alignment positions by way of the observation optical system or scanning optical system in the alignment optical system. Actually, when the best focus position is determined at each alignment action and the alignment is effected under the condition where the mask and the plate are positioned at their best focus positions, no relative positioning errors occur due to the difference in wavelength between the exposure light and the alignment light.

Figure 23:
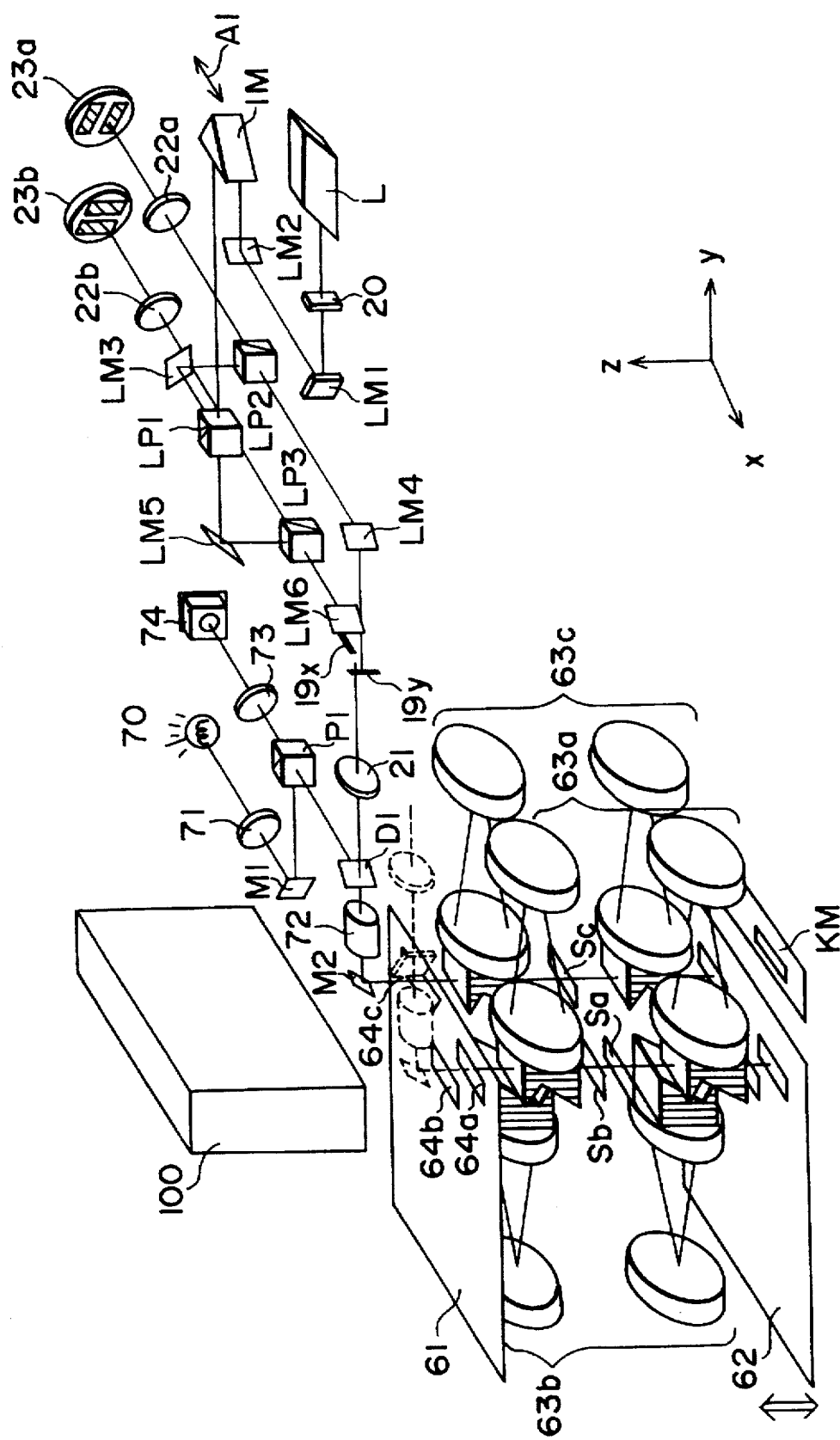
FIG. 23 is a perspective view showing the constitution of an exposure apparatus having a reference mark.

Nevertheless, when the best focus position is determined at each alignment action, throughput may deteriorate. Accordingly, as shown in FIG. 23, a reference mark KM is preferably disposed on a plate stage over a range in which the alignment position is movable. Then, change in the best focus position due to difference in wavelength between the exposure light and the alignment light is obtained beforehand and change in focus position with reference to the image height of the projection optical system is stored as offset information. Such offset information is a characteristic specific to the projection optical system. Accordingly, on the basis of the best focus information with respect to a specific image height of the projection optical system obtained by an auto-focus system provided in the apparatus of FIG. 23 and the offset information concerning the amount of change in the best focus position with reference to the image height of the projection optical system, highly accurate alignment can be performed by the auto-focus system alone. Namely, the relative positioning errors resulting from change in the best focus position due to difference in wavelength can be avoided.

In this case, the position being read out by the auto-focus system is actually different from the alignment position. Accordingly, when there is waviness in the plate, unevenness in the coated resist, or the like, the best focus information cannot always be obtained strictly at each alignment position. As a result, errors may remain in relative positioning.

However, when a plurality of positions are measured by the auto-focus system, the influence of the above-mentioned wariness in the plate, unevenness in the coated resist, or the like can be minimized.

Also, when there is astigmatism due to difference in wavelength between the exposure light and the alignment light, the measuring direction may be divided into the x-direction and the y-direction, which are orthogonal to each other, whereby performing two-dimensional alignment measurement. Further, in a visual field of the projection optical system, the mark may be simultaneously measured in the x-direction and the y-direction on a line which is directed at 45° with respect to the x- and y-directions.

Also, though it is not problematic when a projection optical system comprising, for example, two sets of Dyson type optical systems or Offner type optical systems, there may occur difference in magnification due to difference in wavelength between the exposure light and the alignment light in the case of other projection optical systems.

In this case, positioning is effected with the exposure light by using the reference mark KM and then, under this condition, at least one of the plate and mask is moved in the z-direction so as to perform their positioning with the alignment light. Then, the difference in magnification (i.e. magnification chromatic aberration) due to difference in wavelength between the exposure light and the alignment light can be determined for each image height of the projection optical system. Accordingly, difference in magnification due to the image height of the projection optical system (in the xy-plane) and difference in the best focus positions in the z-direction can be corrected as an offset at the time of alignment.

In particular, as shown in FIG. 23, in a scan type exposure apparatus in which a scanning exposure operation is performed while the mask and the plate are relatively moved with respect to the projection optical system, a single scan may be performed for alignment and then light-exposure may be effected with its returning scan. Accordingly, the alignment scan in the outgoing pass is effected with an offset in the z-direction corresponding to the difference in the best focus positions caused by the difference in wavelength between the exposure light and the alignment light. In this case, when the above-mentioned alignment is performed with the positional detection in the z-direction effected by the auto-focus system, the mask and the plate can be positioned with respect to each other accurately with a low cost without deteriorating throughput even when the alignment positions become numerous.

In the above embodiments, the scanning beam is optically swept or scanned on the alignment mark. But the present invention can be also applied to the relative movement between the alignment mark and the scanning beam. Accordingly, in single alignment operation, the position at which the beam should be projected is fixed on X-Y plane as shown in FIG. 8 and a carriage supporting the mask or the plate is moved on the X-Y plane so that the beam scanning on the alignment mark may be performed.

Figure 25A:
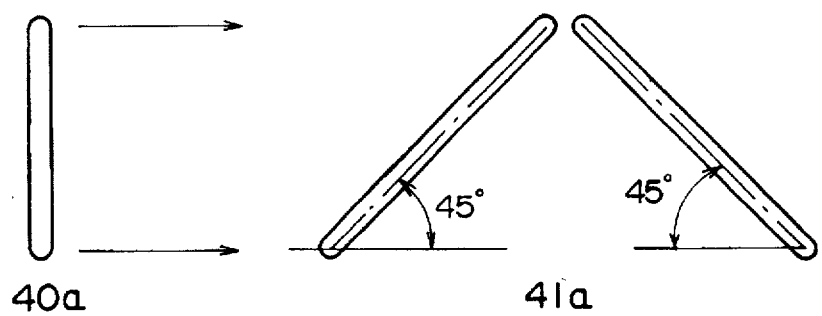
FIGS. 25A–25E show pairs of various patterns of scanning beams and alignment marks usable in the third embodiment.
Figure 25B:
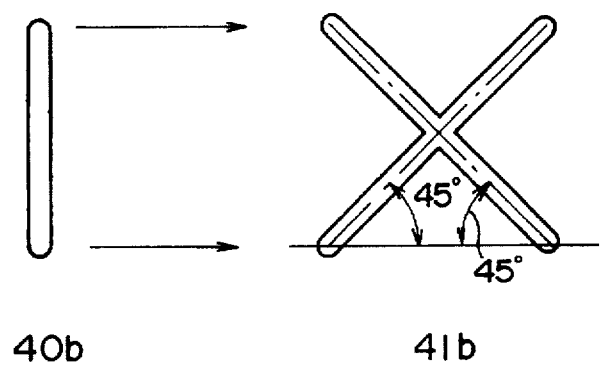
Figure 25C:
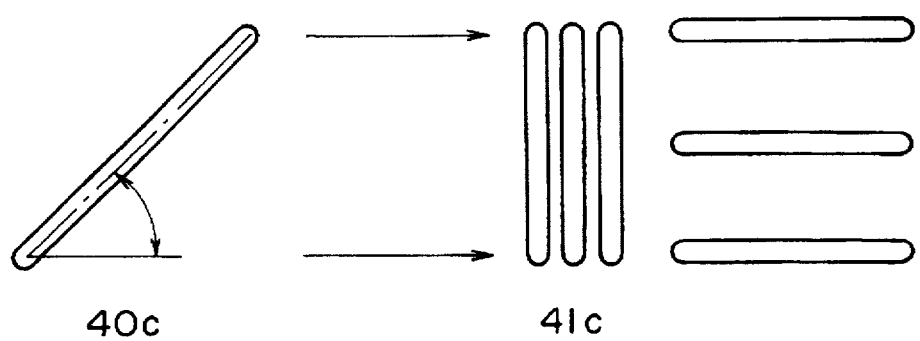
Figure 25D:
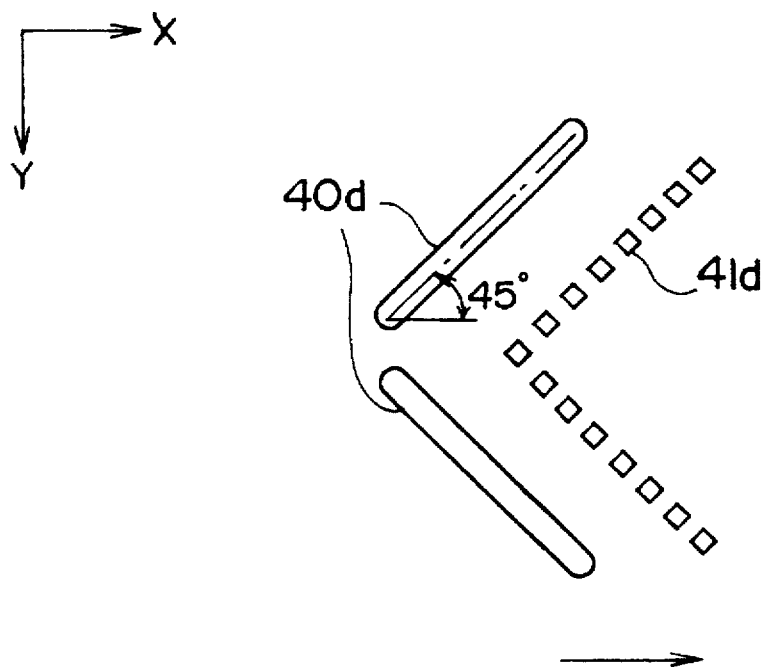
Figure 25E:
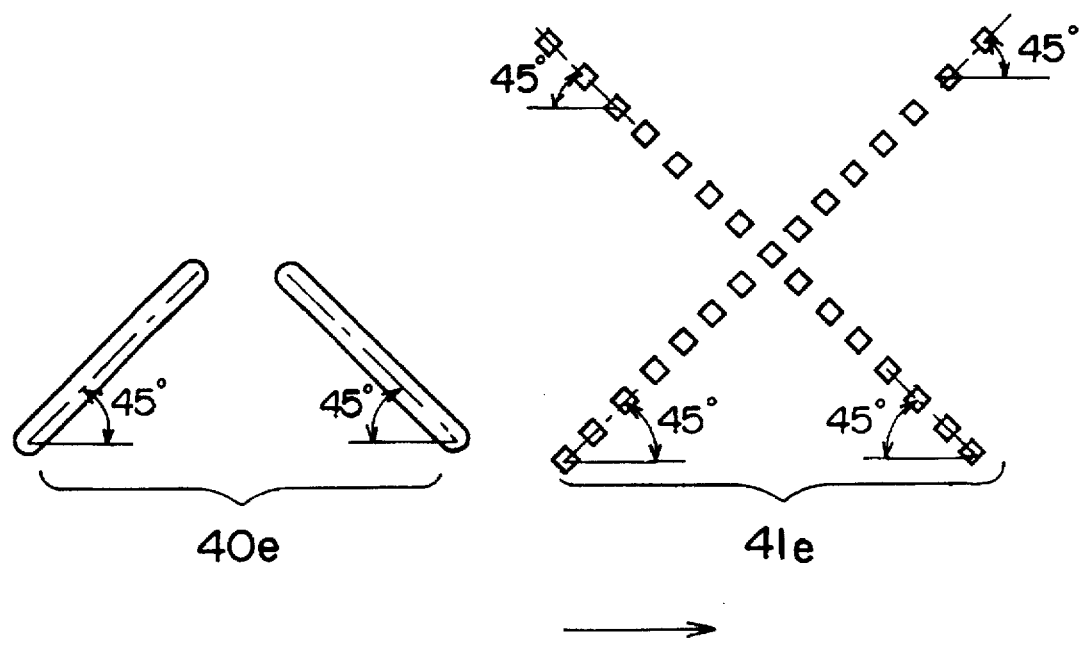

Referring to FIGS. 24 and 25A–24E, the third embodiments will be explained below.

In FIG. 24, a mask 1 is mounted on a mask table 37 and a plate 3 is mounted on a plate holder 31. The plate holder is mounted on a moving carriage 36 through a plate stage 32 and the mask table is fixed on the moving carriage. Further, as shown in FIG. 24, the illumination optical system 1 and the projection optical system 2 is not moved but fixed. The carriage 36 is connected to a motor 35 and a air guide or sliding bearing is arranged between the carriage 36 and a base 34. The carriage 36 is moved with respect to the base 34 by driving of the motor 35. The apparatus shown in FIG. 24, the beam is not swept on the mask 1 and the plate 3 but the mask and the plate are moved so that the scanning of the beam is performed on them by the movement of the carriage 36. In the apparatus, a pair of a scanning beam 40a–40e and an alignment mark 41a–41e as shown in FIGS. 25A–25E is used. As shown in FIGS. 25A–25E, the scanning beam is inclined to the alignment mark by substantially 45 degree in a scanning direction, the alignments along X and Y directions can be performed by a scanning operation along a single direction. As to principle in alignment in the third embodiment, it is omitted because it is as the same as that of the first and second embodiments.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

The basic Japanese Applications No. 323925/1994 and No. 323926/1994 both filed on Dec. 1, 1994 are hereby incorporated by reference.

What is claimed is:

1. In an exposure apparatus in which an image of a pattern formed in a first substrate is projected on and transferred to a second substrate by way of a projection optical system, a method of alignment of said first and second substrates with each other comprising the steps of:

a first step for forming, based on a luminous flux supplied from a light source system, a scan beam in a visual field area of said first substrate with respect to a first optical system and optically scanning said scan beam in a predetermined direction, said scan beam scanning an area including a grating-like first mark formed on said first substrate;

a second step for detecting a diffracted and reflected light component from said first mark generated by said scan beam formed at said first step;

a third step for forming, by way of said first optical system, based on said scan beam formed at said first step, a scan beam which scans an area including a second mark formed on said second substrate and detecting a diffracted and reflected light component from said second mark, a numerical aperture of said first optical system being smaller than $\lambda/p$ wherein $\lambda$ indicates the wavelength of light supplied from said light source system and p indicates a mark pitch of said first mark; and a fourth step for measuring, based on the signal detected at said second step and the signal detected at said third step, a positional deviation between said first and second substrates.

2. A method of alignment according to claim 1, wherein a duty ratio of said first mark is selected such that intensity of a light component which passes through said first mark without being diffracted thereby and then reaches said second mark is not higher than a predetermined value.

3. A method of alignment according to claim 1, wherein said first optical system is identical to said projection optical system.

4. A method of alignment according to claim 1, wherein an aperture stop is disposed within said first optical system.

5. A method of alignment according to claim 4, wherein said aperture stop has a variable aperture size.

6. A method of alignment according to claim 1, wherein said projection system has a plurality of projection optical units arranged in a predetermined direction for forming, on said second substrate, a same-magnification erected image of the pattern formed in said first substrate.

7. A method of alignment according to claim 6, wherein said scan beam formed at said first step is formed in each of two visual field areas with respect to two of said projection optical units respectively disposed at both ends in said predetermined direction.

8. A method of alignment according to claim 7, wherein, at said first step, two scan beams which are spatially separated from each other and have scanning directions different from each other are formed, as said scan beam, in the visual field area on said first substrate with respect to one of said projection optical units disposed at one end in said predetermined direction, while two scan beams which are spatially separated from each other and have scanning directions different from each other are formed, as said scan beam, in the visual field area on said first substrate with respect to one of said projection optical units disposed at the other end in said predetermined direction.

9. An alignment method according to claim 8, wherein the scanning directions of said two scan beams formed in the visual field area on said first substrate with respect to said projection optical unit disposed at one end in said predetermined direction are orthogonal to each other, while the scanning directions of said two scan beams formed in the visual field area on said first substrate with respect to said projection optical unit disposed at the other end in said predetermined direction are orthogonal to each other.

10. In an exposure apparatus in which an image of a pattern formed in a first substrate is projected on and transferred to a second substrate by way of a projection optical system, a method of alignment of said first and second substrates with each other comprising the steps of:

a first step for supplying an alignment light component, from an alignment optical system which is disposed relatively movable with respect to said projection optical system, to a first mark formed at an arbitrary position on said first substrate and a second mark formed at an arbitrary position on said second substrate;

a second step for detecting, based on light components from said first and second marks, relative positions of said first and second substrates with respect to each other by a detection means; and a third step for detecting focus-matching information data of said first and second substrates with respect to the position of said alignment optical system at the positions of said first and second marks, respectively, by said detection means.

11. A method of alignment according to claim 10, wherein said detection means comprises:

a scan beam forming optical system for forming, based on said alignment light component, a scan beam on said first substrate;

a scanning means for optically scanning the scan beam formed on said first substrate; and photoelectric detectors for respectively photoelectrically detecting a light component from said first mark generated by the scan beam formed on said first substrate and a light component from said second mark generated by the scan beam formed on said second substrate by way of said projection optical system, said detection means detecting, respectively based on signals obtained from said photoelectric detectors, the focus-matching information data of said first and second substrates with respect to said alignment optical system.

12. A method of alignment according to claim 10, wherein said detection means comprises:

an illumination optical system for illuminating said first substrate with an illumination luminous flux thereon based on said alignment light component; and an image-generating means for generating images of said first and second marks respectively based on the light component from said first mark with respect to said illumination luminous flux and the light component from said second mark with respect to said illumination luminous flux by way of said projection optical system, said detection means detecting, based on image signals obtained from said image-generating means, the focus-matching information data of said first and second substrates with respect to said alignment optical systems.

13. A method of alignment according to claim 10, wherein said detection means comprises:

a storage means for storing a focus-matching information datum of said second substrate with reference to an image height of said projection optical system which has been detected beforehand based on a reference mark formed within substantially the same plane as said second substrate and a focus means for detecting the focus-matching information datum of said second substrate at a predetermined position on said second substrate, said detection means detecting, based on the focus-matching information datum at said predetermined position obtained from said focus means and the focus-matching information datum stored in said storage means, the focus-matching information datum of said second substrate with respect to said alignment optical system.

14. A method of alignment according to claim 10, wherein said projection system has a plurality of projection optical units arranged in a predetermined direction for forming, on said second substrate, a same-magnification erected image of the pattern formed in said first substrate.

15. A method of alignment according to claim 14, wherein, at said second step, said alignment optical system detects the relative positions of said first and second substrates with respect to each other while relatively moving said first and second substrates with respect to said projection optical system in one direction orthogonal to said predetermined direction and after said third step, the pattern of the image formed in said first substrate is projected on and transferred to said second substrate by way of said projection optical system while said first and second substrates are relatively moved with respect to said projection optical system in the other direction orthogonal to said predetermined direction.

16. A method according to clam 1, wherein beam scanning in said first step is preformed by scanning means arranged between said first substrate and said light source for optically scanning said scanning beam.

17. A method according to claim 1, wherein said scanning of said first step is performed by movement of said first and second substrate.

18. A method of according to claim 10, said detection means comprises:

scanning beam forming optical system, for forming a scanning beam on said first substrate based on said alignment beam;

scanning means for optically scanning said scanning beam;

a photoelectric detector for photoelectrically detecting a light from said first substrate which is generated by said scanning beam and a light from said second mark which is formed on said second substrate by said projection optical system respectively, and said detecting means detects focus matching information of said first and second substrate respectively based on signals obtained in said photoelectric detector, said focus alignment data relating to said alignment optical system.

* * * * *